US006852466B2

(12) United States Patent
Trefonas, III et al.

(10) Patent No.: US 6,852,466 B2
(45) **Date of Patent: *Feb. 8, 2005**

(54) PHOTORESIST COMPOSITIONS PARTICULARLY SUITABLE FOR SHORT WAVELENGTH IMAGING

(75) Inventors: Peter Trefonas, III, Medway, MA (US); Gary N. Taylor, Northboro, MA (US)

(73) Assignee: Shipley Company, L.L.C., Marlborough, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,468

(22) Filed: Dec. 23, 1998

(65) Prior Publication Data

US 2003/0157428 A1 Aug. 21, 2003

(51) Int. Cl.[7] ................................................ G03F 7/038

(52) U.S. Cl. ................................ 430/270.1; 430/281.1; 430/282.1; 430/320; 430/905; 430/913

(58) Field of Search ........................... 430/270.1, 281.1, 430/282.1, 320, 905, 913

(56) References Cited

U.S. PATENT DOCUMENTS

| | | | | | |
|---|---|---|---|---|---|
| 5,514,520 | A | * | 5/1996 | Thackeray et al. | 430/270.14 |
| 5,731,123 | A | * | 3/1998 | Kawamura et al. | 430/176 |
| 5,733,705 | A | | 3/1998 | Bantu et al. | |
| 5,847,218 | A | * | 12/1998 | Ohsawa et al. | 564/430 |
| 5,876,900 | A | * | 3/1999 | Watanabe et al. | 430/288.1 |
| 5,929,271 | A | * | 7/1999 | Hada et al. | 560/126 |
| 5,968,712 | A | * | 10/1999 | Thackeray et al. | 430/326 |
| 6,136,501 | A | * | 10/2000 | Trefonas et al. | 430/270.1 |
| 6,280,911 | B1 | * | 8/2001 | Trefonas, III | 430/326 |

FOREIGN PATENT DOCUMENTS

| | | |
|---|---|---|
| EP | 0 558 280 A1 | 2/1993 |
| EP | 0 611 998 A2 | 8/1994 |
| EP | 0 677 788 A1 | 10/1995 |
| EP | 0 843 220 A1 | 5/1997 |
| EP | 0 837 368 A1 | 10/1997 |
| EP | 0 887 705 A1 | 6/1998 |
| EP | 0 856 773 A1 | 8/1998 |
| JP | 304792/92 | 10/1992 |

OTHER PUBLICATIONS

Database WPI, Section Ch, Week 199919, Derwent Publications Ltd., London, GB; AN 1999–218980, XP002133479 & JP 11 052575 A (Sumitomo Chem Co Ltd), Feb. 26, 1999 *Abstract.

* cited by examiner

*Primary Examiner*—Yvette C. Thornton
(74) *Attorney, Agent, or Firm*—Peter F. Corless; Darryl P. Frickey; Edwards & Angell, LLP

(57) ABSTRACT

The present invention provides novel photoresist compositions that comprise a resin binder, a photoacid generator compound and an added amine component. In a first aspect, the added amine preferably is 1) non-aromatic 2) has from about 9 to about 16 carbon atoms, 3) contains no primary or secondary amine groups, and/or 4) contains no multiple tertiary amine groups where two tertiary groups are separated by a linkage of optionally substituted ethylene. In a related aspect, the added amine is a non-aromatic amine that comprises either 1) a tertiary nitrogen alicyclic ring member, and preferably is at junction position between a bicyclic or other multi-ring ring system; or 2) a tertiary nitrogen that is not a ring member, and is substituted by at least two tertiary or quaternary carbon radicals.

9 Claims, No Drawings

PHOTORESIST COMPOSITIONS PARTICULARLY SUITABLE FOR SHORT WAVELENGTH IMAGING

BACKGROUND OF THE INVENTION

1. Field of the Invention

The present invention relates to new photoresist compositions, particularly chemically-amplified positive-acting resists that can be imaged at extremely short wavelengths such as 193 nm.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes*, McGraw Hill Book Company, New York, ch. 2, 1975 and by Moreau, *Semiconductor Lithography, Principles, Practices and Materials*, Plenum Press, New York, ch. 2 and 4, both incorporated herein by reference for their teaching of photoresist compositions and methods of making and using the same.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer.

While currently available photoresists are suitable for many applications, current resists also can exhibit significant shortcomings, particularly in high performance applications such as formation of highly resolved sub-half micron and sub-quarter micron features.

In this regard, photoresists that could be successfully imaged at extremely short wavelengths such as 193 nm (provided by an ArF exposure tool) would be highly desirable. Use of such short exposure wavelengths can enable formation of smaller features. Accordingly, a photoresist that yields well-resolved images upon 193 nm exposure could enable formation of extremely small (e.g. sub-0.25 $\mu$m) features that respond to constant industry demands for smaller dimension circuit patterns, e.g. to provide greater circuit density and enhanced device performance However, current photoresists are generally designed for imaging at relatively higher wavelengths, such as I-line (365 nm) and G-line (436 nm) exposures. Even advanced resist products, such as those imaged with a KrF laser (ca. 248 nm), utilize exposure wavelengths that are substantially higher than 193 nm.

Such current photoresists are generally unsuitable for imaging at 193 nm. In particular, prior resists exhibit poor resolution (if any image at all can be developed) upon exposure to 193 nm. Among other things, current photoresists can be highly opaque to extremely short exposure wavelengths such as 193 nm, thereby resulting in poorly resolved images. Efforts to enhance transparency at 193 nm can result in resists can compromise other lithographic properties such as substrate adhesion, which in turn can dramatically compromise image resolution.

It thus would be desirable to have new photoresist compositions, particularly resist compositions that can be imaged at 193 nm.

SUMMARY OF THE INVENTION

The present invention provides new photoresist compositions, including resists that can be effectively imaged at extremely short wavelengths such as 193 nm. Preferred resists of the invention are chemically-amplified positive-acting resists that contain an added amine.

More particularly, in a first aspect, the resists of the invention in general comprise a resin, a photoacid generator and an added amine component. The amine preferably is 1) non-aromatic, 2) has from about 7 to about 20 carbon atoms, more preferably from about 9 to about 16 carbon atoms, and/or 3) contains no primary or secondary amine groups. It is further preferred that the amine contains no multiple tertiary amine groups where two tertiary groups are separated by a linkage of optionally substituted —$CH_2CH_2$— (i.e. optionally substituted ethylene). The terms primary, secondary and tertiary amine groups are used herein in accordance with well-recognized meaning, i.e. a primary amine has two hydrogen substituents and one non-hydrogen substituent; a secondary amine has one hydrogen substituent and two non-hydrogen substituents; and a tertiary amine has three non-hydrogen substituents.

We have found that photoresists that contain such an amine additive exhibit surprisingly enhanced lithographic results, particularly upon imaging at short exposure wavelengths such as sub-200 nm wavelengths, particularly 193 nm. See, for instance, the results set forth in the examples which follow.

In a related aspect, the amine component of a resist of the invention is a "hindered amine" which is a non-aromatic amine that comprises either 1) a tertiary nitrogen alicyclic ring member, and preferably is at junction position between a bicyclic or other multi-ring ring system; or 2) a tertiary nitrogen that is not a ring member, and is substituted by at least two secondary or tertiary carbon radicals, preferably two tertiary carbon radicals such as tert-butyl and the like. Thus, exemplary preferred hindered amines of group 1) include diazabicycloundecene and diazabicyclononene. A preferred hindered amine of group 2) is di-tert-butylethanolamine. References herein to a "tertiary" carbon radical indicate the carbon radical has two non-hydrogen substituents (i.e. —$\underline{C}HRR^1$ where R and $R^1$ are the same or different and each is other than hydrogen); and references herein to a "quaternary" carbon radical indicate the carbon radical has three non-hydrogen substituents (i.e. —$\underline{C}RR^1R^2$ where R, $R^1$ and $R^2$ are each the same or different and each is other than hydrogen). See, for instance, Morrison and Boyd, *Organic Chemistry*, particularly at page 85 ($3^{rd}$ ed., Allyn and Bacon), for a discussion of those terms secondary and tertiary.

Other amines are significantly less suitable for use in photoresists of the invention and therefore are excluded from the invention. In particular, we have found that use of non-cyclic amines that do not contain multiple substitution of tertiary or quaternary carbon radicals can result in delamination and cracking of a resist coating layer. For example, trioctyl amine, dimethylaminopyridine and ammonium compounds all can cause cracking of a resist coating layer. See, for instance, the results set forth in the examples which follow.

While a wide variety of photoacid generators (PAGs) may be suitably employed in photoresists of the invention, preferred PAGs for use in resists of the invention are non-ionic compounds. Suitable non-ionic PAGs include e.g. imidosulfonates, sulfonate esters, halogenated compounds that generate a halo-acid (e.g. HBr) upon photoactivation, and the like. As referred to herein, the term non-ionic photoacid generator is used in accordance with its art-recognized meaning, i.e. a non-ionic PAG does not have any ionic bonds, but rather typically has all covalent-type bonds. See, for example, Morrison and Boyd, *Organic Chemistry*, pages 3–5 ($3^{rd}$ ed., 1981).

The photoresist compositions of the invention can provide highly resolved relief images upon exposure to extremely short wavelengths, particularly 193 nm. The photoresists of the invention preferably are chemically-amplified positive resists, which utilize photoacid-induced cleavage of pendant polymer groups of the resin binder to provide solubility differentials between exposed and unexposed areas of a resist coating layer.

Preferred deblocking polymers for use as a resin binder component of resists of the invention include acrylate resins that have pendant ester groups that can react to provide polar acid groups in the presence of photogenerated acid.

Preferred polymers for use as a resist resin binder component in extremely short wavelength imaging applications (e.g. sub-200 nm imaging, particularly 193 nm) are substantially free of any phenyl or other aromatic groups. For example, preferred polymers contain less than about 1 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists of the invention.

Preferred resists of the invention exhibit suitable properties for imaging at 193 nm, including good adhesion (e.g., no visible (naked eye) delamination or cracking through development) to an underlying substrate surface, such as a silicon wafer or other microelectronic wafer surface, a glass or plastic flat panel display surface, an antireflective coating (ARC), etc. Preferred resists also exhibit good resolution upon development (e.g., vertical sidewalls, no feature swelling), even at sub-0.25 μm feature sizes.

The invention also provides methods for forming relief images, including methods for forming a highly resolved relief image such as a pattern of lines where each line has essentially vertical sidewalls and a line width of about 0.40 microns or less, and even a width of about 0.25 or 0.20 microns or less. The invention further provides articles of manufacture comprising substrates such as a microelectronic wafer substrate having coated thereon a polymer, photoresist or resist relief image of the invention.

Other aspects of the invention are disclosed infra.

DETAILED DESCRIPTION OF THE INVENTION

As stated above, photoresists of the invention are preferably chemically-amplified positive resists that in general comprise a resin binder, a photoacid generator (PAG) and an added amine.

In a first aspect, the added amine preferably 1) non-aromatic 2) has from about 7 to about 20 carbon atoms, more preferably from about 9 to about 16 carbon atoms, and/or 3) contains no primary or secondary amine groups. It is further preferred in this aspect that the added amine contains no multiple tertiary amine groups where two tertiary groups are separated by a linkage of optionally substituted —$CH_2CH_2$— (i.e. optionally substituted ethylene).

In a related aspect, the added amine is a non-aromatic amine that comprises either 1) a tertiary nitrogen alicyclic ring member, and preferably is at junction position between a bicyclic or other multi-ring ring system; or 2) a tertiary nitrogen that is not a ring member, and is substituted by at least two tertiary or quaternary carbon radicals, preferably two quaternary carbon radicals. Hindered amines of type 1), i.e. that contain a tertiary nitrogen alicyclic ring members, preferably are bicyclic rings, rather than tricyclic or other multi-cyclic structures.

By stating that the amine is non-aromatic, it is meant that the compound contains an amine group that is not part of an aromatic ring, although the compound may be substituted with an aromatic substituent. Thus, for instance, with respect to the above-specified hindered amine additive, the tertiary nitrogen of 1) or 2) is not a ring member of an aromatic ring, although the compound may have an aromatic amine substituent. Preferably, however, the amine component of resists of the invention is free of any aromatic amine moieties, more preferably free of any aromatic moieties of any type.

An added amine of resists of the invention preferably is not excessively large. For example, preferably the total number of non-hydrogen atoms (e.g. C, N, O, etc.) of the hindered amine is about 40 or 35 or less, more preferably about 30 or less, still more preferably about 27, 26 or 25 or less total atoms other than hydrogen, yet more preferably about 24 total atoms other than hydrogens.

On the other hand, the added amine should be sufficiently non-volatile so it is not removed during a pre-exposure bake step of a resist formulation, where the carrier solvent is removed. Thus, preferably an added amine has at least about 5 or 6 non-hydrogen atoms, more preferably at least about 7 or 8 non-hydrogen atoms. Added amines having about 8, still more preferably about 9, 10 or 11 non-hydrogen atoms also will be preferred.

In general, a hindered added amine preferably will have from about 5 to about 35 or 40 non-hydrogen atoms, more typically from about 5 to about 30 non-hydrogen atoms. In many instances, preferred will be a hindered amine having from about 6 to about 25 non-hydrogen atoms, and even more preferred will be an added amine having from about 6 to about 24 non-hydrogen atoms. As discussed above, in the first aspect of the invention, the added amine preferably has from about 7 to about 20 carbon atoms, more preferably from about 9 to about 16 carbon atoms.

Specifically preferred added amines for resists of the invention include the following:

diazobicycloundecene;
diazabicyclononene;
di-butylethanolamine including di-tert-butylethanolamine;
dimethylundecylamine;
1,8-diazabicyclo[5.4.0]undec-7-ene;
tri(propanol)amine including tri(isopropanol)amine;
sparteine;
N-ethyl dicyclohexyl amine;
pentrol;
tri-butylamine including tri-isobutylamine;
N,N-dibutyl-2-amino-ethanol;
and the like.

An added amine may be suitably used in a relatively wide range of amounts in a photoresist of the invention. For example, the added amine may suitably be present in amount of about 0.1 to 5 to 10 weight percent, based on total solids (all components except solvent) of a resist composition. Generally preferred is about 5 mole % of the added amine relative to theoretical amount of photoacid that can be generated by the PAG.

Preferred polymers for use as a resin binder have a deblocking monomer unit that can react with photogenerated acid. Suitable deblocking groups include pendant ester groups that can be provided e.g. by reaction of acrylate monomers. For example, suitable deblocking pendant ester groups include those of the Formula —WC(═O)$OR^5$, wherein W is a linker such as a chemical bond, an alkylene particularly $C_{1-3}$ alkylene, or carbocyclic aryl such as phenyl, or aryloxy such as phenoxy, and $R^5$ is a suitable ester moiety such as an optionally substituted alkyl (including cycloalkyl) suitably having from 1 to about 20 carbons, more preferably about 4 to about 12 carbons; optionally substituted alkenyl (including cycloalkenyl) group suitably having from 2 to about 20 carbons, more preferably about 4 to about 12 carbons; optionally substituted alkynyl group suitably having from 2 to about 20 carbons, more preferably about 4 to about 12 carbons; optionally substituted alkoxy group suitably having from 1 to about 20 carbons, more preferably 2 to about 12 carbons; or a heteroalicyclic group that contains one or more N, O or S atoms and one or more rings having from 4 to about 8 ring members such as tetrahydrofuranyl, thienyl, tetrahydropyranyl, morpholino and the like. Specifically preferred $R^5$ groups include e.g. t-butyl, tetrahydropyran, ethoxyethyl, or an alicyclic group including bridged groups such as such as adamantyl including 2-methyl-2-adamantyl, norbornyl, isobornyl and the like. Also preferred are polymers having ester repeat units of the above Formula where $R^5$ is a noncyclic or single ring alkyl group having 5 or more carbons and two or more secondary or tertiary carbon radicals, such as pendant esters of the following structures 1 through 17 (such polymers are also disclosed in copending U.S. application Ser. No. 09/143,462, filed on Aug. 28, 1998:

1

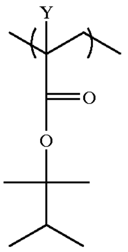

2

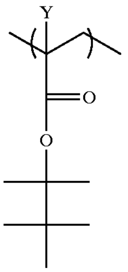

3

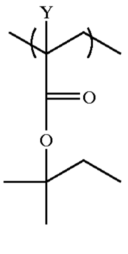

-continued
4
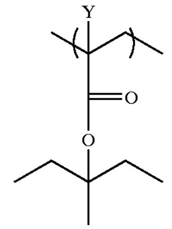
5
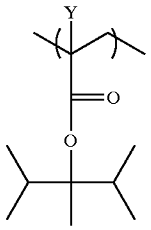
6
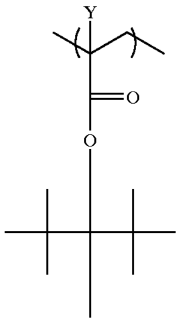
7
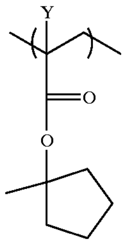
8
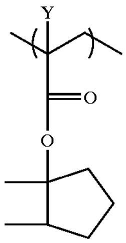
9
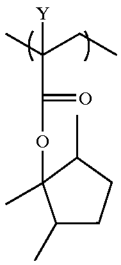
-continued
10
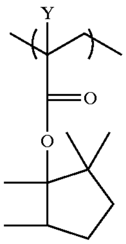
11
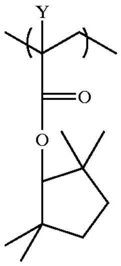
12
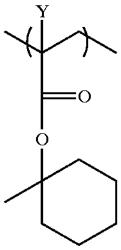
13
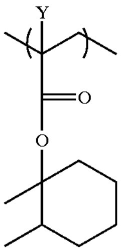
14
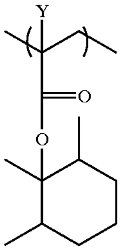
15
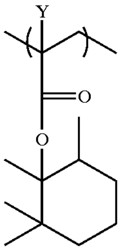

-continued

16

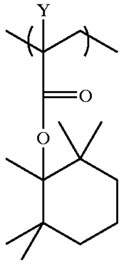

17

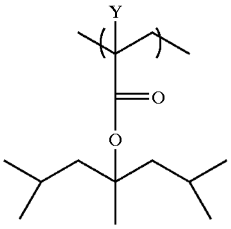

In each of the above structures 1 through 17, the substituent Y is preferably hydrogen or methyl, more preferably methyl.

Polymers for as a resin binder component also may have other units such as pendant cyano and itaconic anhydride groups. Preferably, the itaconic anhydride moiety will be directly pendant to the polymer backbone, i.e. the moiety is directly pendant to a polymer bridge group without any alkylene, aryl or other group interposed between the polymer bridge group and the itaconic anhydride group. While the cyano group is preferably directly pendant to the polymer backbone, a linker group also may be interposed between the cyano group and a polymer bridge group.

Polymers used as resin binders of resists of the invention optionally may contain still further units such as groups that contribute to aqueous developability of a photoresist. For example, preferred polymer groups that contribute to aqueous developability contain carboxy or hydroxy moieties such as may be provided by condensation of acrylic acid, methacrylic acid, 2-hydroxyethyl methacrylate, or other monomers. Other optional polymer units include those that may be provided by condensation of a vinyl alicyclic group, e.g. 2-adamantyl-2-methyl methacrylate, isobornyl methacrylate and the like, or a non-cyclic alkyl group such as t-butyl methacrylate and the like.

Polymers of the invention can be prepared by a variety of methods. One suitable method is free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, dimethylformamide and the like. Suitable reaction temperatures for any particular system can be readily determined empirically by those skilled in the art based on the present disclosure. Monomers that can be reacted to provide a polymer of the invention can be readily identified by those skilled in the art based on the present disclosure. For example, suitable monomers include e.g. acrylonitrile, methacrylonitrile, allylcyanide, itaconic anhydride and the like. A variety of free radical initiators may be employed to prepare the copolymers of the invention. For example, azo compounds may be employed such as azo-bis-2,4-dimethylpentanenitrile. Peroxides, peresters, peracids and persulfates also could be employed. See the examples which follow for synthesis and use of preferred resin binders.

Preferably a polymer used as a resin binder component of a resist of the invention will have a weight average molecular weight ($M_w$) of 1,000 to about 100,000, more preferably about 2,000 to about 30,000, still more preferably from about 2,000 to 15,000 or 20,000, with a molecular weight distribution ($M_w/M_n$) of about 3 or less, more preferably a molecular weight distribution of about 2 or less. Molecular weights (either $M_w$ or $M_n$) of the polymers of the invention are suitably determined by gel permeation chromatography.

As discussed above, the polymers of the invention are highly useful as a resin binder component in photoresist compositions, particularly chemically-amplified positive resists. Photoresists of the invention in general comprise a photoactive component and a resin binder component that comprises a polymer as described above.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. As discussed above, preferred PAGs for use in resists of the invention are non-ionic compounds, although ionic PAGs such as onium salts also can be employed if desired.

One group of preferred PAGs for use in the resists of the invention include imidosulfonates such as compounds of the following formula:

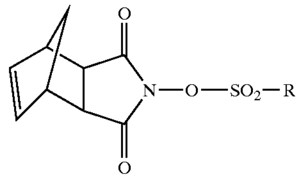

wherein R is camphor, adamantane, alkyl (e.g. $C_{1-12}$ alkyl) and perfluoroalkyl such as perfluoro($C_{1-12}$alkyl), particularly perfluoro anions of perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also may be employed such as sulfonate salts. Two suitable agents are the following PAGS 1 and 2:

1

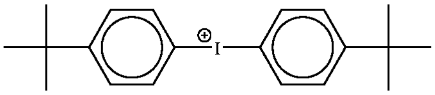

-continued

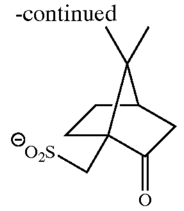

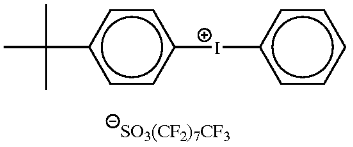

2

Such sulfonate compounds can be prepared as disclosed in European Patent Application 96118111.2 (publication number 0783136), which details the synthesis of above PAG 1. Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to about 5–10° C. and then (+/−)-10-camphorsulfonic acid added followed by neutralization with ammonium hydroxide.

Also suitable are the above two iodonium compounds complexed with anions other than the above-depicted camphorsulfonate groups. In particular, preferred anions include those of the formula $RSO_3^-$ where R is adamantane, alkyl (e.g. $C_{1-12}$ alkyl) and perfluoroalkyl such as perfluoro ($C_{1-12}$ alkyl), particularly perfluoro counter anions of perfluorooctanesulfonate, perfluorononanesulfonate and the like.

Other known PAGS also may be employed in the resists of the invention. For example, N-sulfonylocxyimides may be employed such as those described in International application WO94/10608, or non-ionic halogenated PAGs that generate a holgen acid (e.g. HBr) upon exposure to activating radiation as described e.g. in U.S. Pat. No. 5,128,232 to Thackeray et al.

Photoresists of the invention also may contain other optional materials. For example, optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 $mJ/cm^2$, dependent upon the exposure tool and the components of the photoresist composition.

Coating layers of the resist compositions of the invention are preferably photoactivated by a short exposure wavelength, particularly a sub-200 nm exposure wavelength. A particularly preferred exposure wavelength is about 193 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLES 1–19

Photoresist Compositions of the Invention

In Examples 1–11, photoresist compositions were prepared by dissolving a combination of 0.2538 g of the photoacid generator perfluoro-octanesulphonate-norbornene dicarboximide (that photoacid generator referred to below as "POND" and was obtained from Daychem Corporation), and 3.365 g of the resist polymer of Example 20 below into a solution containing an amount of the specified amine compound listed in Table 1 below (about $1.5\times10^{-5}$ chemical equivalents of the amine compound), 0.0036 g of Silwet 7604 (Dow Corning Co., USA) and 21.375 g of propyleneglycol methyl ether acetate (Dow Corp., USA). The amine compounds were obtained from Aldrich Corporation. After dissolution, the resist composition was filtered through either a 0.1 μm or 0.2 μm Teflon filter into a clean bottle.

In Examples 12–19, photoresist compositions were prepared by dissolving a combination of 0.1813 g of perfluoro-octanesulphonate-norbornene dicarboximide (POND, obtained from Daychem Corporation), and 3.365 g of the resist polymer of Example 20 below into a solution containing an amount of the specified amine compound listed in Table 1 below, 0.0036 g of Silwet 7604 (Dow Corning Co., USA) and 21.375 g of propyleneglycol methyl ether acetate (Dow Corp., USA). The amine compounds were obtained from Aldrich Corporation. After dissolution, the resist composition was filtered through either a 0.1 μm or 0.2 μm Teflon filter into a clean bottle.

TABLE 1

Photoresist compositions of Examples 1 through 19

| Example No. | Amine Compound | Weight of Amine Added | Weight of POND added |
|---|---|---|---|
| 1 | THEDA | 0.0044 g | 0.2538 g |
| 2 | DMUDA | 0.0030 g | 0.2538 g |
| 3 | tri(nonafluro-n-butyl)amine | 0.0101 g | 0.2538 g |
| 4 | tri(isopropanol)amine | 0.0029 g | 0.2538 g |
| 5 | N,N,N',N'-tetraethylenediamine | 0.0013 g | 0.2538 g |
| 6 | sparteine | 0.0018 g | 0.2538 g |
| 7 | N-ethyl dicyclohexyl amine | 0.0032 g | 0.2538 g |
| 8 | pentrol | 0.0020 g | 0.2538 g |
| 9 | tri-isobutylamine | 0.0028 g | 0.2538 g |
| 10 | di-n-butyl N-ethanol amine | 0.0026 g | 0.2538 g |
| 11 | DBU | 0.0023 g | 0.2538 g |
| 12 | Proton Sponge | 0.0023 g | 0.1813 g |
| 13 | di-n-butyl N-ethanol amine | 0.0023 g | 0.1813 g |
| 14 | Coumarin 1 | 0.0023 g | 0.1813 g |
| 15 | tri-n-octylamine | 0.0023 g | 0.1813 g |
| 16 | dimethylamino pyridine | 0.0023 g | 0.1813 g |
| 17 | tertra-n-butyl ammonium hydroxide | 0.0023 g | 0.1813 g |
| 18 | DBU | 0.0023 g | 0.1813 g |
| 19 | DABCO | 0.0023 g | 0.1813 g |

In the above Table 1, THEDA=N,N,N',N'-tetrakis(2-hydroxypropyl)ethylenediamine; DMUDA=dimethylundecyl amine; DBU=1,8-diazabicylco[5.4.0]undec-7-ene; DABCO=1,4-diazabicyclo[2.2.2]octane

EXAMPLE 20

Resist Polymer Synthesis

A photoresist binder polymer with a molar feed ratio of 31:22:10:14:23 of isobornyl methacrylate:tert-butyl methacrylate:methacrylic acid: methacrylonitrile: itaconic annhydride was prepared through the following procedure: Into a 500 mL flask was placed 12.54 g of itaconic annhydride, 15.20 g of tert-butyl methacrylate, 4.58 g of methacrylonitrile, 4.28 g of methacrylic acid, 33.57 g of isobornyl methacrylate, and 100 mL of anhydrous tetrahydrofuran. All reagents were at least 99% pure. The flask was fitted with a magnetic stirring bar, a condenser and an addition funnel. All ingredients were sparged with $N_2$ gas for 20 minutes prior to reaction. In the condenser was placed 0.75 g of Vazo52 free-radical initiator and 25 mL of anhydrous tetrahydrofuran. The solution was brought to 70° C., and then the initiator was added over a 20 minute period. The flask was maintained at 70° C. for 14 hours, and then cooled to room temperature. Polymer was obtained by precipitation into 3L of hexane, and dried in a Buchner funnel. Then the polymer was re-dissolved into 120 mL of acetone and reprecipitated into 3 L of hexane, and collected on a Buchner funnel. The polymer was dried overnight in a vacuum oven at room temperature. Yield was 49.96 g

EXAMPLES 21–38

Lithographic Testing

The photoresist compositions of Examples 1–19 above were lithographically tested. To assess resolution capability, high-voltage cross-sectional scanning electron microscopic methods were used to examine the printed features. Minimal resolution in an imaged 1:1 pitch grating by choosing an exposure dose such that the patterned 1:1 160 nm lines and 160 nm spaces on the mask actually measured essentially 160 nm in size respectively, and then determining the smallest, essentially full-thickness line which cleanly developed, had a flat top and did not leave residue on the substrate. Photospeed is the exposure dose required in forming such a pattern.

The lithographic processing was performed on modern wafer-processing tools (manufactured by FSI and SVG Companies) using both 150 mm and 200 mm silicon wafers. All processing was done in an essentially base-contaminant free atmosphere (<5 ppb measure amines/ammonia). The wafers were coated with an organic ARC composition prior to subsequent processing. The photoresist was spun onto the wafers at about 3000 rpm and baked at 140° C. for 60 seconds (PAB, post-apply bake) on a 150 μm proximity-gap plate and then rapidly cooled to room temperature to give a film thickness of 4200 Å. Then the film was exposed using a resolution-test pattern on a ISI 0.60 NA ArF (193 nm) wafer stepper at a partial coherence setting of 0.70. Immediately afterwards, the film was baked at 155° C. for 60 seconds (PEB, post-exposure bake) on a 150 μm proximity-gap plate, and then rapidly cooled to room temperature. Immediately afterwards the film was developed using a 60 second track-single-puddle process with 0.26 N tetramethylammonium hydroxide developer. Lithographic results are detailed in Table 2 below.

TABLE 2

Results from lithographic testing (Examples 21–38) of Photoresist Compositions of Examples 1–19 respectively.

| Example | Composition of Example | Es | ResL | Comments |
|---|---|---|---|---|
| 21 | 1 | >45 | 0.16 | slow photospeed |
| 22 | 2 | 34 | 0.14 | good results |
| 23 | 3 | <15 | ND | poor adhesion and resolution |
| 24 | 4 | 34 | 0.14 | good results |
| 25 | 5 | 36 | 0.15 | fair performance |
| 26 | 6 | 36 | 0.14 | good results |
| 27 | 7 | 38 | 0.14 | good results |
| 28 | 8 | 24 | 0.14 | rough sidewalls |
| 29 | 9 | 22 | 0.14 | good results |
| 30 | 10 | 34 | 0.14 | good results |
| 31 | 11 | 34 | 0.14 | good results |
| 32 | 12 | 50 | 0.15 | resist composition turns yellow color |
| 33 | 13 | 52 | 0.15 | good results |
| 34 | 14 | 52 | 0.18 | resist lines "crack" and peel |
| 35 | 16 | 60 | 0.17 | resist lines break and become wavy |
| 36 | 17 | ND | ND | gross adhesion failure, composition decomposes |
| 37 | 18 | 52 | 0.15 | good results |
| 38 | 19 | ca. 70 | 0.17 | granular appearance |

In Table 2 above, ResL refers to the resolution at Es. Es is in units of $mJ/cm^2$ and ResL is in units of nm. ND indicates that the specified parameter could not be determined because of resist failure or other poor performance.

As the results indicate in Table 2 above, amine additives of the invention exhibit excellent lithographic results at 193 nm imaging, particularly with respect to the comparison (non-invention) amine additives.

More specifically, Examples 22, 24, 26–27, 29–31, 33 and 37 use resist compositions containing amine additives of the invention. These examples showed good resolution, namely 0.14 micron patterns, with good pattern fidelity. These compositions display imaging results which are suitable for advanced lithographic processing.

Examples 23, 25, 28, 32, 34–36 and 38 use compositions which include amines which are not part of preferred aspects of the invention. Lithographic results with these examples showed poor pattern fidelity, adhesion failure and evidence of decomposition in solution.

Examples 32 and 36 use compositions which include additives of Proton Sponge and tetraethylammonium hydroxide, respectively, both of which have been reported to yield reasonably good results. It has been found those additives can provide reasonably good results when formulated for use in a composition containing a poly(4-vinylphenol) polymer, and ionic PAG and exposed using 248 nm radiation. However, unexpectedly, when used in a composition which contained a non-aromatic polymer and a non-ionic PAG, those additives gave poor results.

Similarly, it has been found that Coumarin 1 can provide reasonably good results when formulated for use in a composition containing a poly(4-vinylphenol) polymer, and ionic PAG and exposed using 248 nm radiation. However, unexpectedly, when used in a resist composition which contained a non-aromatic polymer and a non-ionic base, that additive gave poor results. See the results of Example 34 above.

The foregoing description of the invention is merely illustrative thereof, and it is understood that variations and modification can be made without departing from the spirit or scope of the invention as set forth in the following claims.

What is claimed is:

1. A photoresist composition comprising a resin that comprises a polymer that contains pendant photoacid labile moieties and is substantially free of any aromatic groups, a photoacid generator and a non-aromatic amine compound that comprises a tertiary nitrogen alicyclic ring member.

2. A photoresist of claim 1 wherein the tertiary nitrogen ring member is at a junction position of at least two rings of a multiple ring compound.

3. A photoresist of claim 1 wherein the amine compound is a bicyclic compound.

4. A photoresist of claim 1 wherein the tertiary nitrogen radical is substituted by two tertiary carbon radicals and contains from about 6 to about 24 non-hydrogen atoms.

5. A photoresist of claim 1 wherein the photoacid generator is a non-ionic compound.

6. The photoresist of claim 1 wherein the resin binder comprises a polymer that contains pendant photoacid labile moieties and is substantially free of any aromatic groups.

7. A method of forming a positive photoresist relief image, comprising:

(a) applying a coating layer of a photoresist of claim 1 on a substrate; and (b) exposing and developing the photoresist layer to yield a relief image.

8. The method of claim 7 wherein the photoresist layer is exposed with radiation having a wavelength of about 193 nm.

9. An article of manufacture comprising a microelectronic wafer substrate or flat panel display substrate having coated thereon a layer of the photoresist composition of claim 1.

* * * * *